(12) United States Patent
Sadaka et al.

(10) Patent No.: US 9,728,458 B2
(45) Date of Patent: Aug. 8, 2017

(54) METHODS FOR FABRICATION OF SEMICONDUCTOR STRUCTURES USING LASER LIFT-OFF PROCESS, AND RELATED SEMICONDUCTOR STRUCTURES

(71) Applicant: Soitec, Crolles (FR)

(72) Inventors: Mariam Sadaka, Austin, TX (US); Bernard Aspar, Saint-Ismier (FR); Chrystelle Lagahe Blanchard, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/416,895

(22) PCT Filed: Jul. 8, 2013

(86) PCT No.: PCT/IB2013/001490
§ 371 (c)(1),
(2) Date: Jan. 23, 2015

(87) PCT Pub. No.: WO2014/020390
PCT Pub. Date: Feb. 6, 2014

(65) Prior Publication Data
US 2015/0179520 A1      Jun. 25, 2015

Related U.S. Application Data

(60) Provisional application No. 61/677,815, filed on Jul. 31, 2012.

(51) Int. Cl.
*H01L 21/00*     (2006.01)
*H01L 21/78*     (2006.01)
(Continued)

(52) U.S. Cl.
CPC ............ *H01L 21/78* (2013.01); *H01L 21/268* (2013.01); *H01L 21/304* (2013.01);
(Continued)

(58) Field of Classification Search
CPC . H01L 21/268; H01L 21/304; H01L 21/6835; H01L 21/78; H01L 21/7813; H01L 33/0079
(Continued)

(56) References Cited

U.S. PATENT DOCUMENTS 6,303,468 B1    10/2001   Aspar et al.
6,335,258 B1     1/2002   Aspar et al.
(Continued)

FOREIGN PATENT DOCUMENTS

CN    1145202 C     4/2004
CN    101574759 A   11/2009
WO    2011061664 A1  5/2011

OTHER PUBLICATIONS

International Written Opinion for International Application No. PCT/IB2013/001490 dated Jan. 13, 2014, 5 pages.
(Continued)

*Primary Examiner* — Mohammed Shamsuzzaman
(74) *Attorney, Agent, or Firm* — TraskBritt

(57) ABSTRACT

Methods of fabricating a semiconductor structure include bonding a carrier wafer over a substrate, removing at least a portion of the substrate, transmitting laser radiation through the carrier wafer and weakening a bond between the substrate and the carrier wafer, and separating the carrier wafer from the substrate. Other methods include forming circuits over a substrate, forming trenches in the substrate to define unsingulated semiconductor dies, bonding a carrier substrate over the unsingulated semiconductor dies, transmitting laser radiation through the carrier substrate and weakening a bond between the unsingulated semiconductor dies and the carrier substrate, and separating the carrier substrate from the unsingulated semiconductor dies. Some methods include thinning at least a portion of the substrate,
(Continued)

leaving the plurality of unsingulated semiconductor dies bonded to the carrier substrate.

13 Claims, 6 Drawing Sheets

(51) Int. Cl.
*H01L 21/268* (2006.01)
*H01L 21/304* (2006.01)
*H01L 21/683* (2006.01)
*H01L 33/00* (2010.01)

(52) U.S. Cl.
CPC ...... *H01L 21/6835* (2013.01); *H01L 21/7813* (2013.01); *H01L 33/0079* (2013.01)

(58) Field of Classification Search
USPC .......... 438/463, 462, 460, 107; 257/783, 88, 257/745
See application file for complete search history.

(56) References Cited

U.S. PATENT DOCUMENTS

| | | | |
|---|---|---|---|
| 6,756,286 B1 | 6/2004 | Moriceau et al. | |
| 6,809,044 B1 | 10/2004 | Aspar et al. | |
| 6,946,365 B2 | 9/2005 | Aspar et al. | |
| RE39,484 E | 2/2007 | Bruel | |
| 7,754,511 B2 | 7/2010 | Wen et al. | |
| 2005/0269717 A1* | 12/2005 | Ohashi | C09J 7/0296 257/783 |
| 2006/0246687 A1 | 11/2006 | Kaiser et al. | |
| 2008/0070379 A1* | 3/2008 | Kikuchi | H01L 21/76898 438/460 |
| 2010/0081256 A1* | 4/2010 | Uemura | H01L 33/0079 438/462 |
| 2011/0132549 A1 | 6/2011 | Sercel et al. | |
| 2011/0133216 A1* | 6/2011 | Sugawara | H01L 33/0079 257/88 |
| 2011/0266674 A1* | 11/2011 | Hsia | H01L 21/6836 257/745 |
| 2012/0288995 A1* | 11/2012 | El-Ghoroury | H01L 27/14618 438/107 |

OTHER PUBLICATIONS

International Preliminary Report on Patentability for International Application No. PCT/IB2013/001490 dated Feb. 3, 2015, 6 pages.
International Search Report for International Application No. PCT/IB2013/001490 dated Jan. 13, 2014, 3 pages.
Chinese First Office Action for Chinese Application No. 201380040589.1 dated Sep. 5, 2016, 5 pages.
Chinese Second Office Action for Chinese Application No. 201380040589.1 dated Mar. 24, 2017, 7 pages.

* cited by examiner

METHODS FOR FABRICATION OF SEMICONDUCTOR STRUCTURES USING LASER LIFT-OFF PROCESS, AND RELATED SEMICONDUCTOR STRUCTURES

CROSS-REFERENCE TO RELATED APPLICATIONS

This application is a national phase entry under 35 U.S.C. §371 of International Patent Application PCT/IB2013/001490, filed Jul. 8, 2013, designating the United States of America and published in English as International Patent Publication WO 2014/020390 A1 on Feb. 6, 2014, which claims the benefit under Article 8 of the Patent Cooperation Treaty and under 35 U.S.C. §119(e) to U.S. Provisional Patent Application Ser. No. 61/677,815, filed Jul. 31, 2012, the disclosure of each of which is hereby incorporated herein in its entirety by this reference.

FIELD

The present disclosure generally relates to the fabrication of semiconductor structures and devices.

BACKGROUND

Substrates that include one or more semiconductor materials are used to form a wide variety of semiconductor structures and devices including, for example, integrated circuit (IC) devices (for example, logic processors and memory devices), radiation-emitting devices (for example, light-emitting diodes (LEDs), resonant cavity light-emitting diodes (RCLEDs), vertical cavity surface emitting lasers (VCSELs)), radiation sensing devices (for example, optical sensors) and electronic devices utilized in power control systems. Such semiconductor devices are conventionally formed on and/or in a surface of a semiconductor substrate.

Historically, semiconductor substrates used in the semiconductor device manufacturing industry comprise thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. The wafers are then cut into dies by cutting "streets" in the wafers. Silicon wafers may have diameters as large as about thirty centimeters (30 cm) or more (about twelve inches (12 in) or more). Although silicon wafers generally have thicknesses of several hundred microns (for example, about 700 microns) or more, only a very thin layer (for example, less than about three hundred nanometers (300 nm)) of the semiconductor material on a major surface of the silicon wafer is actually used to form active devices on the silicon wafer.

A wide variety of engineered substrates are known in the art and may include semiconductor materials such as, for example, silicon (Si), germanium (Ge), silicon carbide (SiC), III-V type semiconductor materials, and II-VI type semiconductor materials. For example, an engineered substrate may include an epitaxial III-V type semiconductor material formed on a surface of a base substrate, such as aluminum oxide ($Al_2O_3$) (which may be referred to as "sapphire").

Individual semiconductor structures (e.g., dies or wafers) may be relatively thin and difficult to handle with equipment for processing the semiconductor structures. Thus, so-called "carrier" dies or wafers may be attached to the actual semiconductor structures that include therein the active and passive components of operative semiconductor devices. The carrier dies or wafers do not typically include any active or passive components of a semiconductor device to be formed. Such carrier dies and wafers are referred to herein as "carrier substrates." The carrier substrates increase the overall thickness of the semiconductor structures and facilitate handling of the semiconductor structures (by providing structural support to the relatively thinner semiconductor structures) by processing equipment used to process the active and/or passive components in the semiconductor structures attached thereto that will include the active and passive components of a semiconductor device to be fabricated thereon.

Laser lift-off methods may be used to separate portions of substrates in the fabrication of semiconductor structures. For example, an epitaxial layer may be grown on a first substrate, and individual chips may be formed in the epitaxial layer. A second substrate may be bonded to the epitaxial layer. A laser heats the first substrate and releases it from the epitaxial layer. The individual chips remain attached to the second substrate. Such methods are described in, for example, U.S. Pat. No. 7,754,511, issued Jul. 13, 2010, entitled "Laser Lift-Off Method," and U.S. Patent Application Pub. No. 2011/0132549, published Jun. 9, 2011, entitled "Laser Lift Off Systems and Methods," the entire disclosures of each of which are incorporated herein by this reference.

BRIEF SUMMARY

In some embodiments, the present invention includes a method of fabricating a semiconductor structure. The method may include bonding a carrier wafer over a substrate, removing at least a portion of the substrate, transmitting laser radiation through the carrier wafer and weakening a bond between the substrate and the carrier wafer, and separating the carrier wafer from the substrate.

In some embodiments, a method includes forming a plurality of circuits over a substrate, forming trenches in the substrate to define a plurality of unsingulated semiconductor dies, bonding a carrier substrate over the unsingulated semiconductor dies, transmitting laser radiation through the carrier substrate and weakening a bond between the unsingulated semiconductor dies and the carrier substrate, and separating the carrier substrate from the unsingulated semiconductor dies. The plurality of circuits each comprises at least one active component.

In certain embodiments, a method of fabricating semiconductor structures includes forming trenches in a substrate to define a plurality of unsingulated semiconductor dies, bonding a carrier substrate to an exposed surface of each of the plurality of unsingulated semiconductor dies, thinning at least a portion of the substrate, leaving the plurality of unsingulated semiconductor dies bonded to the carrier substrate, transmitting laser radiation through the carrier substrate and weakening a bond between the plurality of unsingulated semiconductor dies and the carrier substrate, and separating the carrier substrate from the plurality of unsingulated semiconductor dies.

BRIEF DESCRIPTION OF THE DRAWINGS

While the specification concludes with claims particularly pointing out and distinctly claiming that which is regarded as the present invention, the advantages of this disclosure may be more readily ascertained from the description of the invention when read in conjunction with the accompanying drawings, in which:

DETAILED DESCRIPTION

Figure 1:
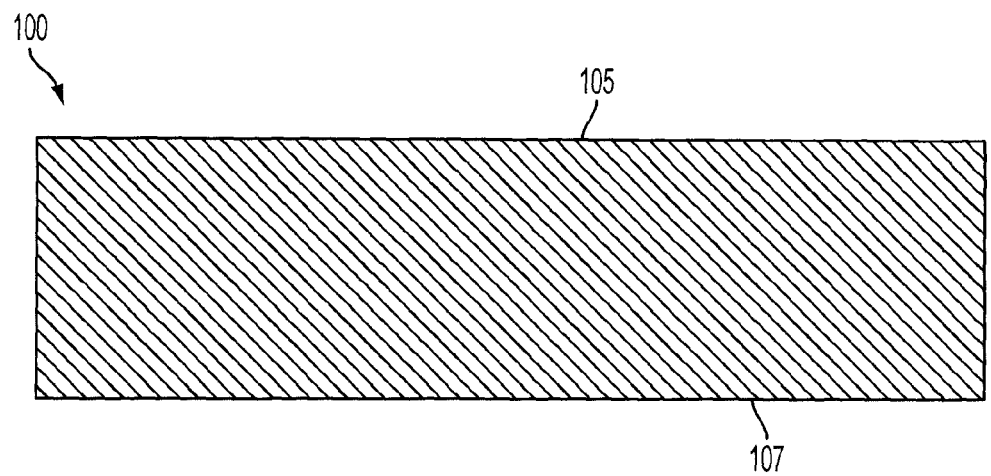
FIG. 1 is a simplified cross-sectional view of a portion of a substrate, such as a wafer, that may be employed in embodiments of the present disclosure.

The following description provides specific details, such as material types and processing conditions, in order to provide a thorough description of embodiments of the disclosure and implementation thereof. However, a person of ordinary skill in the art will understand that the embodiments of the present disclosure may be practiced without employing these specific details and in conjunction with known fabrication techniques. In addition, the description provided herein does not form a complete process flow for manufacturing a semiconductor device or system. Only those process acts and structures necessary to understand the embodiments of the disclosure are described in detail herein. The materials described herein may be formed (e.g., deposited or grown) by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Materials may be grown in situ. While the materials described and illustrated herein may be formed as layers, the materials are not limited to continuous layers and may be formed in other three-dimensional configurations.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive, semiconductor, and/or non-conductive materials.

As used herein, the term "III-V type semiconductor material" means and includes any material predominantly comprised of one or more elements from group IIIA (group 13) of the periodic table (B, Al, Ga, In, and Tl) and one or more elements from group VA (group 15) of the periodic table (N, P, As, Sb, and Bi).

As used herein, the term "II-VI type semiconductor material" means and includes any material predominantly comprised of one or more elements from group IIB (group 12) of the periodic table (Zn, Cd, and Hg) and one or more elements from group VIA (group 16) of the periodic table (O, S, Se, Te, and Po).

As used herein, the term "epitaxial material" means and includes a material that is at least substantially a single crystal of the material and that has been formed over another material such that the single crystal exhibits the crystallographic orientation of the underlying material. The term "epitaxial layer" means a layer of epitaxial material that is at least substantially a single crystal of the material and that has been formed such that the single crystal exhibits a known crystallographic orientation.

Embodiments of the present disclosure include methods of fabricating semiconductor structures. In particular, methods disclosed herein may be used to thin substrates without consuming a carrier substrate, and may be used to singulate dies from relatively larger substrates into a plurality of relatively smaller, discrete structures. In some embodiments, the methods may be used to form semiconductor structures while reusing a carrier substrate and without consuming any significant portion of the carrier substrate. Semiconductor structures formed may or may not contain active components. Example embodiments of methods, as well as examples of structures formed by such methods, are described below with reference to FIGS. 1 through 11.

FIG. 1 is a simplified cross-sectional view of a substrate 100. The substrate 100 may comprise what is referred to in the art as a "die" or a "wafer," and may be generally planar. The substrate 100 may comprise any of a number of materials conventionally used for substrates in the fabrication of integrated circuits. As non-limiting examples, the substrate 100 may comprise an oxide (e.g., aluminum oxide, zirconium oxide, silicon oxide, etc.) or a semiconductor material (e.g., silicon, germanium, a III-V semiconductor material, etc.). The substrate 100 may comprise an amorphous material, such as a glass, in some embodiments. In other embodiments, the substrate 100 may comprise a crystalline material (e.g., polycrystalline or monocrystalline material).

Figure 2:
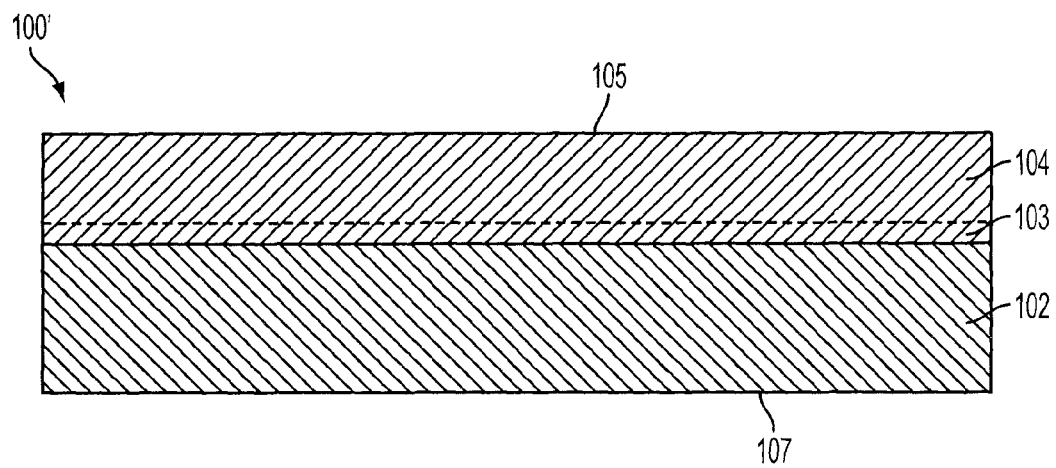
FIG. 2 is a simplified cross-sectional view of a portion of another embodiment of a substrate that may be employed in embodiments of the present disclosure.

As shown in FIG. 1, the substrate 100 may be at least substantially comprised of a single, generally homogeneous material. In other embodiments, however, the substrate 100 may comprise a multi-layer structure. For example, FIG. 2 illustrates a substrate 100' comprising a semiconductor-on-insulator-type (SeOI-type) structure having a relatively thin layer of semiconductor material 104 bonded to a relatively thick base substrate 102 with an intermediate material 103 between the semiconductor material 104 and the base substrate 102. The base substrate 102 may comprise a homogeneous or heterogeneous material. As non-limiting examples, the base substrate 102 may comprise a semiconductor material (e.g., silicon (Si), germanium (Ge), a III-V type semiconductor material, or a II-VI type semiconductor material) or a dielectric material (e.g., an oxide such as silicon dioxide ($SiO_2$) or aluminum oxide ($Al_2O_3$), a nitride such as silicon nitride ($Si_3N_4$), boron nitride (BN) or aluminum nitride (AlN)). The base substrate 102 may comprise a single crystal of any of the aforementioned materials. In other embodiments, the base substrate 102 may be polycrystalline, or may include a number of layers of any of the aforementioned materials.

The semiconductor material 104 may comprise one or more layers of semiconductor material 104. The one or more layers of semiconductor material 104 comprises epitaxial layers in some embodiments.

The intermediate material 103 may comprise, for example, a dielectric material such as silicon oxide (e.g., $SiO_2$), a nitride such as silicon nitride (e.g., $Si_3N_4$), or an oxynitride such as silicon oxynitride (e.g., SiON). The intermediate material 103 may be formed using, for example, CVD, PVD, or ALD. In other embodiments, the intermediate material 103 may be formed by oxidizing and/or nitriding a surface of the base substrate 102.

For the sake of clarity, the thicknesses of the base substrate 102, the intermediate material 103, and the semiconductor material 104 are not shown to scale. The semiconductor material 104 may have a thickness that is substantially less than a thickness of the base substrate 102. As non-limiting examples, the semiconductor material 104 may have an average layer thickness of between about five nanometers (5 nm) and about five hundred microns (500 μm), between about five nanometers (5 nm) and about one hundred microns (100 μm), or even between about five nanometers (5 nm) and about ten microns (10 μm). The base substrate 102 may have an average layer thickness of from about five hundred nanometers (500 nm) to several millimeters or more. The intermediate material 103 may have an average thickness of from about one nanometer (1 nm) to about one hundred nanometers (100 nm).

In some embodiments, the intermediate material 103 and the semiconductor material 104 may be sequentially formed over the base substrate 102 using various methods known in the art such as, for example, hydride vapor phase epitaxy (HVPE), metalorganic vapor phase epitaxy (MOVPE), and molecular beam epitaxy (MBE). Additionally, various methods may be used in forming the semiconductor material 104 to reduce the density of dislocations therein, such as epitaxial lateral overgrowth (ELO), facet-initiated epitaxial lateral overgrowth (FIELO), in-situ masking, and wafer bonding. In other embodiments, the layer of material 104 may be bonded to the substrate 102, and the intermediate material 103 may be formed on one or both of the bonding surfaces of the substrate 102 and the layer of material 104 prior to the bonding process. For example, the layer of material 104 may be transferred to the substrate 102 using processes known in the art as SMARTCUT® processes. Such processes are described in detail in U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entirety by this reference.

Figure 3:
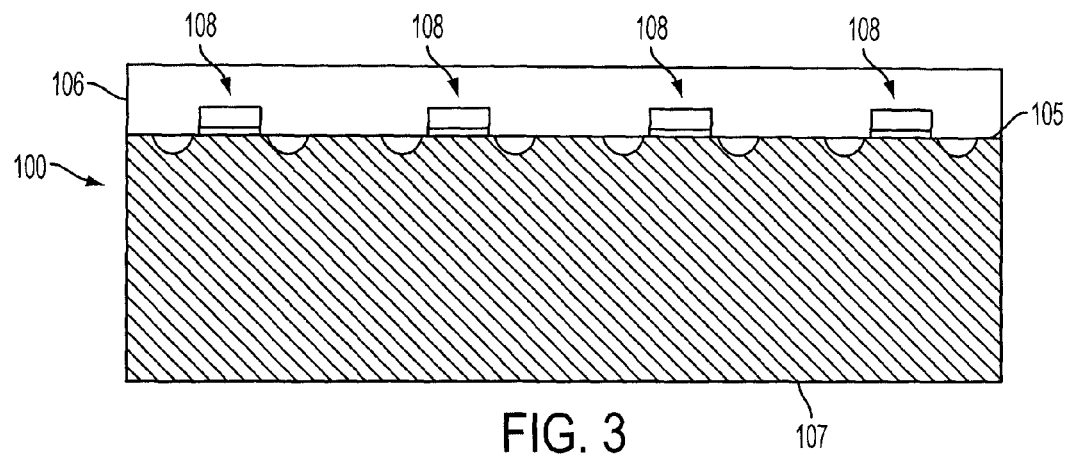
FIGS. 3 and 4 illustrate the fabrication of active components on an active surface of the wafer substrate of FIG. 1.

In some embodiments, active components may be fabricated on a first major surface 105 of the substrate 100 (or the substrate 100'). Active components may include transistors, sources, drains, gates, lines, traces, vias, contact pads, other conductive features, etc. For example, FIG. 3 illustrates an active layer 106 formed on the first major surface 105 that includes a plurality of transistors 108. Thus, the first major surface 105 of the substrate 100 may comprise what is often referred to in the art as an "active surface" of the substrate 100, and the second major surface 107 of the substrate 100 may comprise what is often referred to in the art as a "back surface" of the substrate 100. The transistors 108 may be formed in, on, and/or over the first major surface 105 of the substrate 100 using processes known in the art. As a non-limiting example, the transistors 108 may comprise metal oxide semiconductor field effect transistors (MOSFETs), and may embody complementary metal oxide semiconductor (CMOS) technology. The processes often employed in the art to fabricate such transistors 108 are often referred to in the art as "front-end-of-line" (FEOL) processes.

Figure 4:
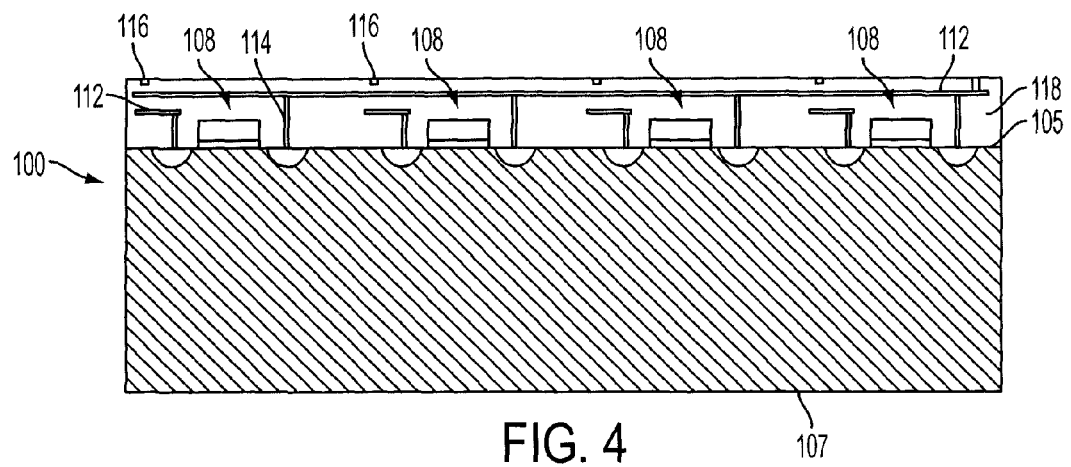

Referring to FIG. 4, after forming the transistors 108, one or more additional layers of active components may be formed over the transistors 108 on a side thereof opposite the first major surface 105 of the substrate 100. The active components may comprise one or more of laterally extending conductive lines 112 (e.g., traces), vertically extending conductive vias 114, and electrical contact pads 116. The active components may comprise electrically conductive material regions (e.g., copper, aluminum, tungsten, etc.) that are at least partially embedded in a dielectric material 118. The one or more layers of active components and surrounding dielectric material 118 may be formed in a layer-by-layer lithographic process. In such processes, layers of dielectric material and layers of conductive material may be deposited and selectively patterned in an alternating manner to form the various active components and the dielectric material 118. The processes often employed in the art to fabricate these active components are often referred to in the art as "back-end-of-line" (BEOL) processes.

Figure 5:
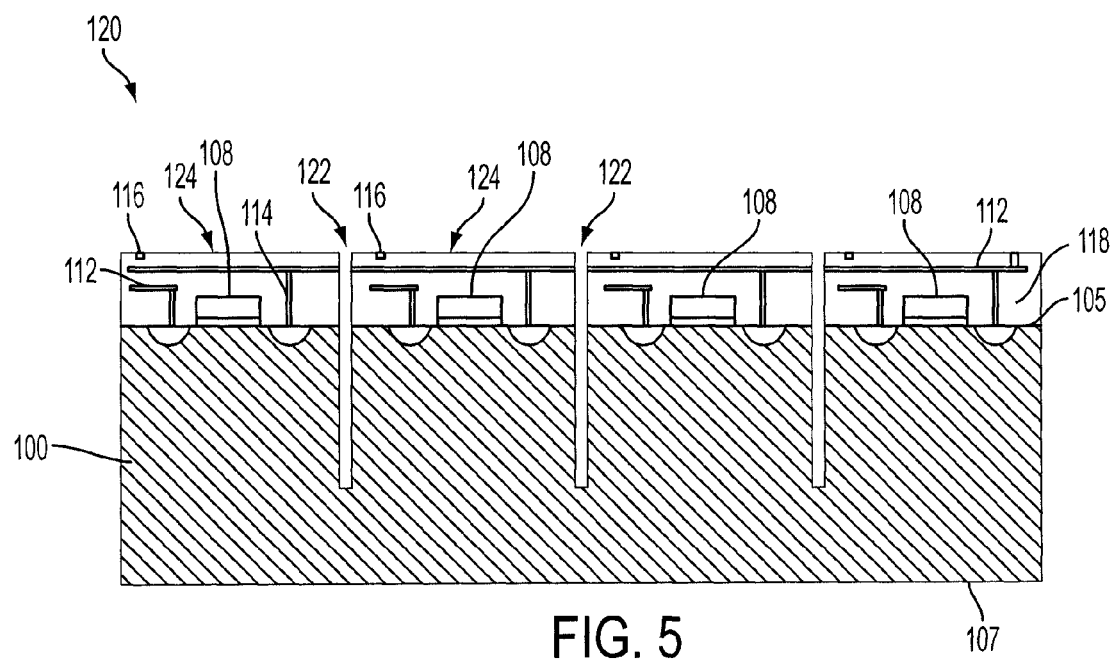
FIG. 5 illustrates trenches formed through the structure of FIG. 4 and partially through the substrate from the active surface thereof.

Referring to FIG. 5, a plurality of trenches 122 may be formed through the dielectric material 118 and through a portion of the substrate 100 from the surface 105 of the substrate 100 to form the semiconductor structure 120. The trenches 122 (which may be referred to in the art as "streets") may divide a portion of the substrate 100 (and the integrated circuits formed thereon, which may include active components such as transistors 108, laterally extending conductive lines 112, vertically extending conductive vias 114, and/or electrical contact pads 116), to form a plurality of sections 124 that are segregated and laterally isolated from one another by the trenches 122. Though each section 124 is shown having a single transistor 108 and associated lines 112, vias 114, and electrical contact pads 116 in FIG. 5, each section 124 may include any number and type of active components (e.g., hundreds, thousands, millions, billions, etc.). Each section 124 may comprise an at least partially fabricated integrated circuit of a semiconductor device (e.g., an electronic signal processor, a memory device, a photoactive device, etc.). Thus, each section 124 may comprise what is referred to in the art as a semiconductor "die," each formed from, and comprising a portion of, the relatively larger wafer. The active components of a single section 124 may be electrically interconnected through the integrated circuit of that section 124, but may be electrically isolated from active components of other sections 124. The sections 124 may remain physically connected to one another through the substrate 100, as the trenches 122 do not extend entirely through the substrate 100. That is, the sections 124 may remain secured to or a part of the substrate 100 after the trenches 122 are formed. The trenches 122 may be formed by any method known in the art, such as by sawing or etching. The trenches 122 may be formed to have a uniform depth (from the perspective of FIG. 5) in some embodiments. In some embodiments, the trenches 122 may extend into the substrate 100 from the surface 105 of the substrate 100 to an average depth of about 100 μm or less, about 50 μm or less, or even about 25 μm or less (although the total depth of the trenches 122 may be greater, since the trenches 122 also extend through the active layers formed over the substrate 100).

Figure 6:
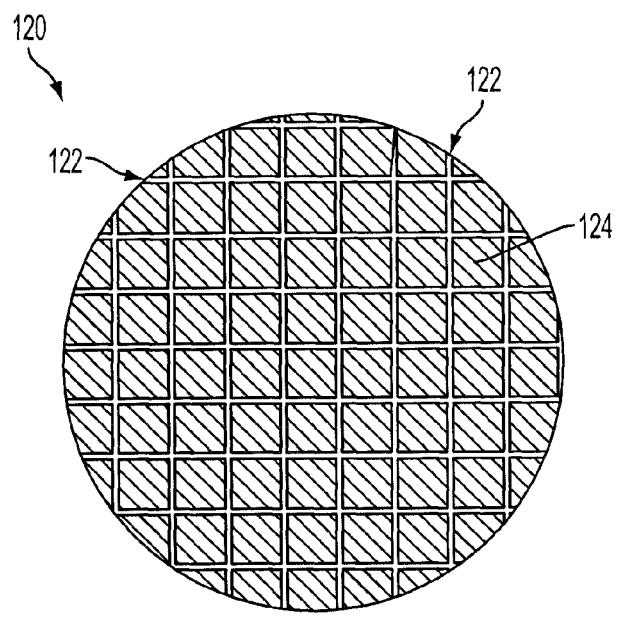
FIG. 6 is a simplified top plan view of the structure, a portion of which is illustrated in FIG. 5.

FIG. 6 shows a top plan view of the semiconductor structure 120. As shown in FIG. 6, in some embodiments, the substrate 100 may comprise a wafer level substrate, and may be generally circular in shape. The trenches 122 may divide the upper portion of the semiconductor structure 120 into rectangular sections 124 in some embodiments, and an integrated circuit may be fabricated in each full rectangular section 124. Thus, there may be two sets of trenches 122 oriented perpendicular to one another.

Figure 7:
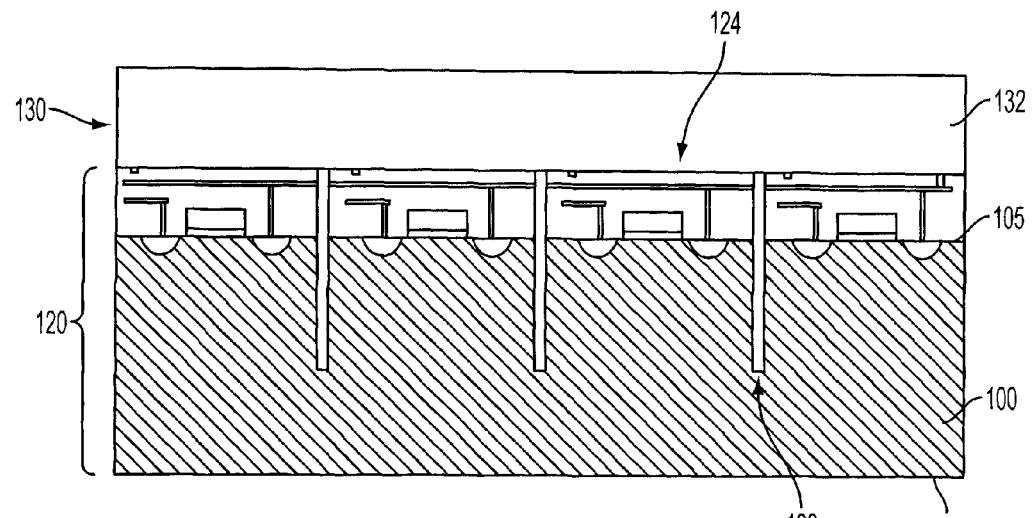
FIG. 7 illustrates a carrier substrate temporarily bonded to the structure of FIGS. 5 and 6 over the active surface of the substrate.

Referring to FIG. 7, a semiconductor structure 130 may be formed by temporarily securing (e.g., bonding) a carrier wafer 132 to the exposed surface of the sections 124, over the active components (e.g., transistors 108, laterally extending conductive lines 112, vertically extending conductive vias 114, and/or electrical contact pads 116 (FIG. 4)). In other words, the carrier wafer 132 may be secured to the sliced portion of the sliced semiconductor structure 120 shown in FIG. 5 over the surface 105 of the substrate 100. The carrier wafer 132 may be secured by any means allowing the carrier wafer 132 to be subsequently removed using a laser lift-off process, as subsequently described herein. For example, in some embodiments, the carrier wafer 132 may be bonded to the semiconductor structure 120 using, for example, an adhesive, a direct bonding process, etc. In some embodiments, the carrier wafer 132 may be secured to the structure 120 of FIGS. 5 and 6 by abutting the carrier wafer 132 against the structure 120 and maintaining an elevated temperature and pressure for a time sufficient to establish direct atomic bonds across the interface between the carrier wafer 132 and the structure 120.

In accordance with embodiments of the present disclosure, the carrier wafer 132 may be or comprise a material that is at least substantially transparent to one or more wavelengths of radiation (i.e., the carrier wafer 132 may transmit substantially all radiation at the selected wavelength) to be subsequently used in a lift-off process to remove the carrier wafer 132. For example, the transmittance of the one or more wavelengths of radiation through the carrier wafer 132 may be about 90% or more, about 95% or more, or even about 99% or more. In some embodiments, the radiation may comprise electromagnetic radiation at one or more wavelengths in the range extending from about 150 nm to about 750 nm, in the range extending from about 400 nm to about 700 nm, or even within the range extending from about 475 nm to about 650 nm.

As a non-limiting example, the carrier wafer 132 may comprise crystalline silicon dioxide ($SiO_2$) or crystalline aluminum oxide ($Al_2O_3$).

Figure 8:
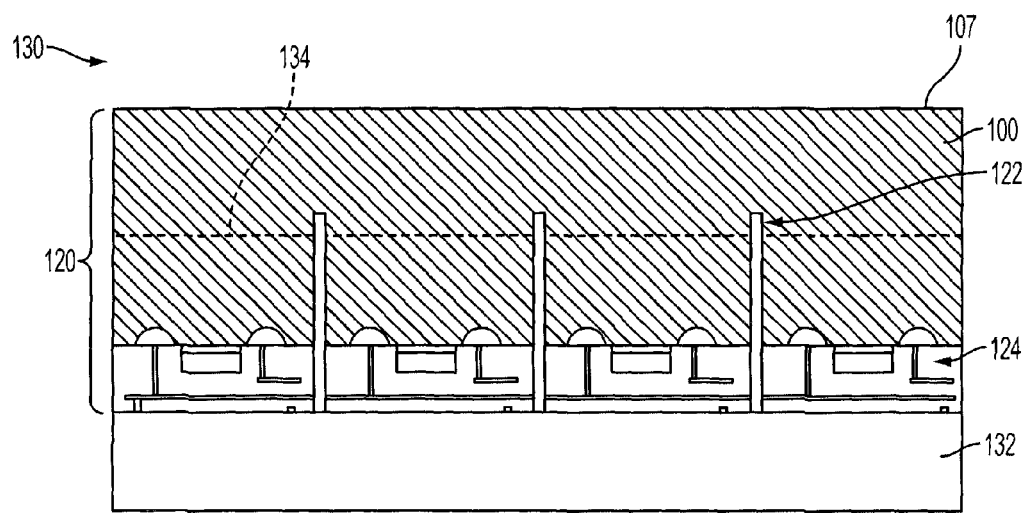
FIG. 8 illustrates a level to which the substrate of FIG. 7 may be thinned from a back surface of the substrate.

Referring to FIG. 8, after temporarily bonding the carrier wafer 132 to the structure 120, a portion of the substrate 100 may be removed from the second major surface 107 thereof to thin the substrate 100. The substrate 100 may be thinned from the second major surface 107 to an extent sufficient to expose the trenches 122 at the second major surface 107 of the thinned substrate 100. For example, the substrate 100 may be thinned to the plane 134 as shown by dashed line in FIG. 8.

By way of example, one or more of a grinding process, a polishing process, and an etching process (e.g., a chemical-mechanical polishing (CMP) process) may be used to remove material of the substrate 100 from the second major surface 107 of the substrate 100. In some embodiments, depending on the original thickness of the substrate 100 and the depth to which the trenches 122 extend into the substrate 100, the thinning process may be used to remove at least about 500 µm, at least about 600 µm, or even 700 µm or more.

Figure 9:
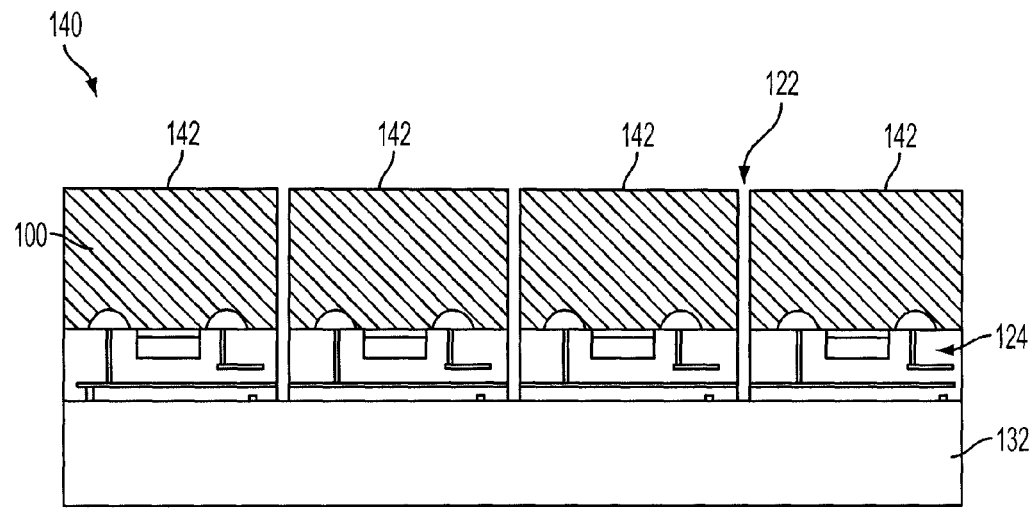
FIG. 9 illustrates the structure of FIG. 8 after thinning the substrate from the back surface thereof.

As shown in FIG. 9, thinning of the substrate 100 results in the formation of a semiconductor structure 140 that includes laterally isolated sections 124, each comprising a thinned portion 142 of the substrate 100 having at least a portion of an integrated circuit formed therein (which integrated circuit may include one or more active components, such as transistors 108, laterally extending conductive lines 112, vertically extending conductive vias 114, and/or electrical contact pads 116 (FIG. 4)) and being bonded to the carrier wafer 132. The trenches 122 are exposed at the second major surface 107 of the substrate 100 after the thinning process, and may extend entirely through the substrate 100 and between the integrated circuits formed on the first major surface 105 of the substrate 100 to the surface of the carrier wafer 132 that is bonded to the sections 124.

Figure 10:
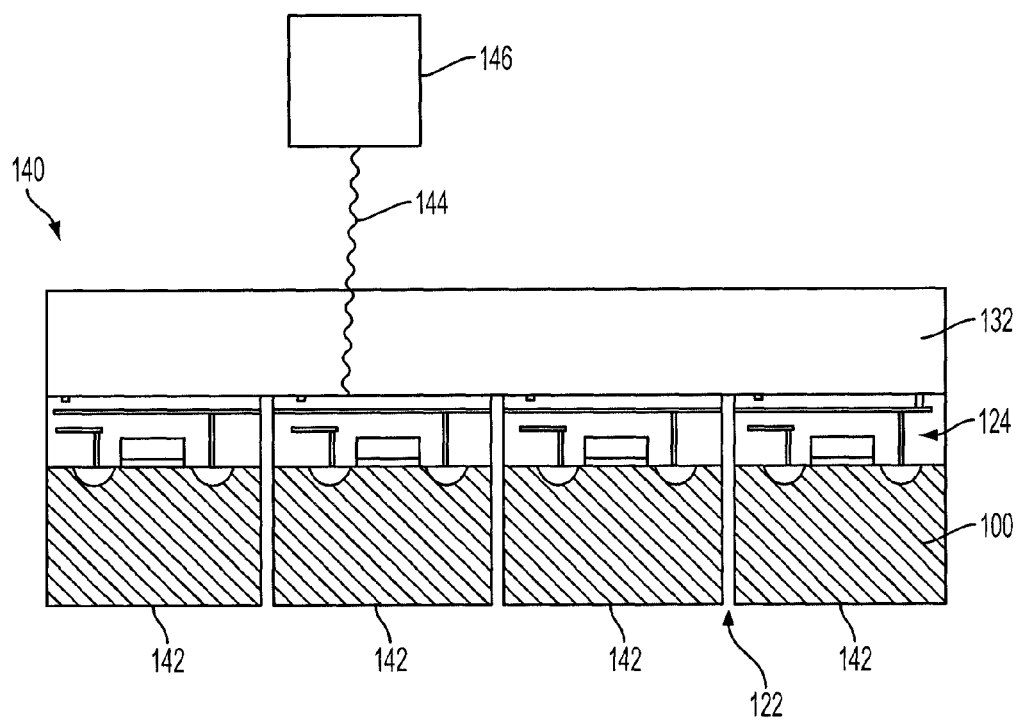
FIG. 10 illustrates a laser-lift off process being used to remove the carrier substrate from the structure of FIG. 9.

Referring to FIG. 10, a laser lift-off process may be used to remove the carrier wafer 132 from the laterally isolated sections 124 to form a plurality of discrete, separate sections 124 disconnected from one another. For example, the semiconductor structure 140 may be exposed to laser irradiation 144 (i.e., radiation from a laser source 146) to remove the carrier wafer 132 from the sections 124. The laser irradiation 144 may cause weakening of the bond between the carrier wafer 132 and the sections 124. In embodiments in which the carrier wafer 132 is a transparent wafer, the sections 124 or the bond or interface between the carrier wafer 132 and the sections 124 may be exposed to the laser irradiation 144 transmitted through the carrier wafer 132. For example, the sections 124 or the bond or interface between the carrier wafer 132 and the sections 124 may be exposed to laser irradiation 144 at a lasing wavelength in a range from about 150 nm to about 750 nm, such as from about 200 nm to about 400 nm. In particular, the sections 124 or the bond or interface between the carrier wafer 132 and the sections 124 may be exposed to radiation at a wavelength of 355 nm emitted from a Nd:YAG laser, or to radiation at a wavelength of 248 nm emitted from a KrF pulsed excimer laser.

The laser irradiation 144 may include short pulses (e.g., pulses of less than about 100 ns) of UV radiation. Absorption of laser irradiation 144 at the interface between the carrier wafer 132 and the sections 124 may cause localized heating of the interface. Thermal energy may diffuse before reaching active components, such that the active components are not damaged by the thermal energy. The laser irradiation 144 may cause localized high temperatures at the interface, such as at least about 600° C., at least about 800° C., or at least about 1000° C. The localized high temperatures may promote decomposition of the inter-atomic bonds between the material of the carrier wafer 132 and/or the sections 124.

Exposure to the laser irradiation 144 may include raster scanning of the laser source 146 with respect to the carrier wafer 132. That is, the laser source 146 and/or the semiconductor structure 140 may translate or rotate between pulses of radiation, such that subsequent laser irradiation 144 illuminates a different part of the interface between the carrier wafer 132 and the sections 124. Translation and/or rotation between pulses of laser irradiation 144 may continue such that a pattern of irradiated areas covers an area to be separated (e.g., the entire interface between the carrier wafer 132 and the sections 124). For example, the pattern of irradiated areas may include a sequence of parallel line segments across the area to be separated.

In some embodiments, the laser irradiation 144 may cause separation of the sections 124 from the carrier wafer 132. In other embodiments, the laser irradiation 144 may weaken the bond between the sections 124 and the carrier wafer 132 without causing separation. An additional stress may be applied to further cause separation of the sections 124 from the carrier wafer 132. For example, the semiconductor structure 140 may be heated, such as to a temperature of at least about 30° C. In some embodiments, the carrier wafer 132 may be removed from the sections 124 by a mechanical force. Laser lift-off techniques are described in U.S. Patent Application Pub. No. 2011/0132549, published Jun. 9, 2011, and titled "Laser Lift Off Systems and Methods," previously incorporated by reference. The carrier wafer 132 and the sections 124 may separate due to differences in coefficients of thermal expansion of the materials. That is, the laser irradiation 144 may heat one or both of the carrier wafer 132 and the sections 124, causing stresses between the carrier wafer 132 and the sections 124. The stresses may cause the carrier wafer 132 and the sections 124 to separate or debond. In some embodiments, a portion of the carrier wafer 132 and/or the sections 124 may undergo a chemical reaction upon exposure to the laser irradiation 144, thus causing separation of the carrier wafer 132 from the sections 124.

Figure 11:
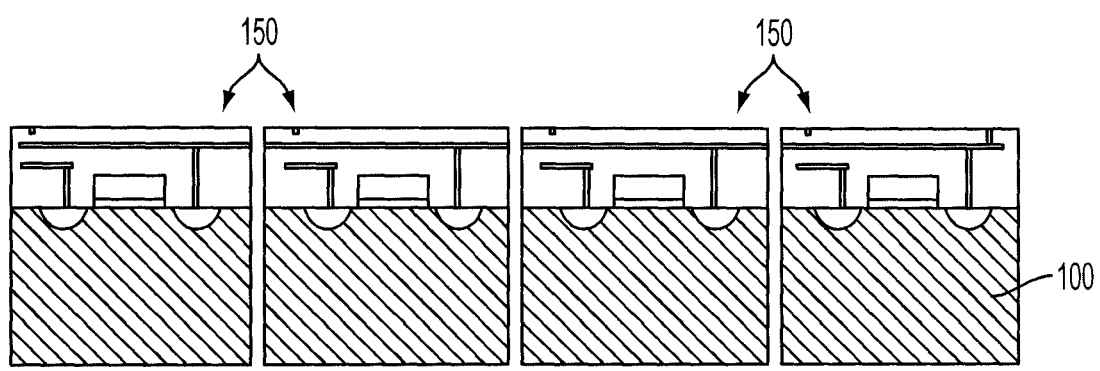
FIG. 11 illustrates individual, discrete semiconductor structures formed upon removal of the carrier substrate as described in relation to FIG. 10.

After removal of the carrier wafer 132, the sections 124 comprise individual semiconductor dies 150, as shown in FIG. 11, that are not connected to one another. That is, the semiconductor dies 150 may be free of material connecting the semiconductor dies 150 to one another. The semiconductor dies 150 may be subjected to further processing as needed or desirable to form functional semiconductor devices suitable for use in electronic devices.

The laser lift-off process used to remove the carrier wafer 132 from the sections 124 may enable the carrier wafer 132 to be removed without consuming or damaging any significant portion of the carrier wafer 132. The carrier wafer 132 may therefore be reused in the formation of additional semiconductor dies using the methods as described herein.

Additional non-limiting example embodiments of the disclosure are described below.

Embodiment 1

A method of fabricating a semiconductor structure, comprising bonding a carrier wafer over a substrate, removing at least a portion of the substrate, transmitting laser radiation through the carrier wafer and weakening a bond between the substrate and the carrier wafer, and separating the carrier wafer from the substrate.

Embodiment 2

The method of Embodiment 1, wherein transmitting laser radiation through the carrier wafer and weakening a bond between the substrate and the carrier wafer comprises exposing the carrier wafer to radiation at a lasing wavelength and transmitting at least about 95% of the radiation at the lasing wavelength.

Embodiment 3

The method of Embodiment 1, wherein transmitting laser radiation through the carrier wafer and weakening a bond between the substrate and the carrier wafer comprises exposing the carrier wafer to radiation at a lasing wavelength and transmitting at least about 99% of the radiation at the lasing wavelength.

Embodiment 4

The method of any of Embodiments 1 through 3, wherein transmitting laser radiation through the carrier wafer and weakening a bond between the substrate and the carrier wafer comprises transmitting laser radiation at a lasing wavelength in a range from about 150 nm to about 750 nm through the carrier wafer.

Embodiment 5

The method of any of Embodiments 1 through 4, further comprising forming a plurality of active components over the substrate, wherein removing at least a portion of the substrate comprises forming trenches between adjacent active components.

Embodiment 6

The method of Embodiment 5, wherein forming trenches between adjacent active components comprises forming trenches through a portion of the substrate.

Embodiment 7

The method of Embodiment 5, wherein removing at least a portion of the substrate further comprises thinning the substrate to expose the trenches.

Embodiment 8

The method of any of Embodiments 1 through 7, wherein removing at least a portion of the substrate comprises thinning the substrate.

Embodiment 9

The method of any of Embodiments 1 through 8, wherein separating the carrier wafer from the substrate comprises separating the carrier wafer from the substrate without consuming the carrier wafer.

Embodiment 10

A method of fabricating semiconductor structures, comprising forming a plurality of circuits over a substrate, forming trenches in the substrate to define a plurality of unsingulated semiconductor dies, bonding a carrier substrate over the unsingulated semiconductor dies, transmitting laser radiation through the carrier substrate and weakening a bond between the unsingulated semiconductor dies and the carrier substrate, and separating the carrier substrate from the unsingulated semiconductor dies. The plurality of circuits each comprises at least one active component.

Embodiment 11

The method of Embodiment 10, further comprising thinning at least a portion of the substrate, leaving the unsingulated semiconductor dies bonded to the carrier substrate.

Embodiment 12

The method of Embodiment 10 or Embodiment 11, wherein separating the carrier substrate from the unsingulated semiconductor dies comprises separating the carrier substrate from the unsingulated semiconductor dies without consuming the carrier substrate.

Embodiment 13

The method of any of Embodiments 10 through 12, wherein bonding a carrier substrate over the unsingulated semiconductor dies comprises bonding a transparent carrier substrate to an exposed surface of the unsingulated semiconductor dies.

Embodiment 14

The method of any of Embodiments 10 through 13, wherein transmitting laser radiation through the carrier substrate and weakening a bond between the unsingulated semiconductor dies and the carrier substrate comprises transmitting radiation at a lasing wavelength in a range from about 150 nm to about 750 nm through the carrier substrate.

Embodiment 15

A method of fabricating semiconductor structures, comprising forming trenches in a substrate to define a plurality of unsingulated semiconductor dies, bonding a carrier substrate to an exposed surface of each of the plurality of unsingulated semiconductor dies, thinning at least a portion of the substrate, leaving the plurality of unsingulated semiconductor dies bonded to the carrier substrate, transmitting laser radiation through the carrier substrate and weakening a bond between the plurality of unsingulated semiconductor dies and the carrier substrate, and separating the carrier substrate from the plurality of unsingulated semiconductor dies.

Embodiment 16

The method of Embodiment 15, wherein bonding a carrier substrate to an exposed surface of each of the plurality of unsingulated semiconductor dies comprises bonding a transparent wafer to an exposed surface of each of the plurality of unsingulated semiconductor dies.

Embodiment 17

The method of Embodiment 15 or Embodiment 16, wherein separating the carrier substrate from the unsingulated semiconductor dies comprises forming a plurality of singulated semiconductor dies.

Embodiment 18

The method of any of Embodiments 15 through 17, further comprising forming trenches in another substrate to define another plurality of unsingulated semiconductor dies, bonding the carrier substrate to an exposed surface of each of the another plurality of unsingulated semiconductor dies, thinning at least a portion of the another substrate, leaving the another plurality of unsingulated semiconductor dies bonded to the carrier substrate, transmitting laser radiation through the carrier substrate and weakening a bond between the another plurality of unsingulated semiconductor dies and the carrier substrate, and separating the carrier substrate from the another plurality of unsingulated semiconductor dies.

Embodiment 19

The method of any of Embodiments 15 through 18, wherein separating the carrier substrate from the plurality of unsingulated semiconductor dies comprises separating the carrier substrate without consuming the carrier substrate.

Embodiment 20

The method of any of Embodiments 15 through 19, wherein transmitting laser radiation through the carrier substrate and weakening a bond between the plurality of unsingulated semiconductor dies and the carrier substrate comprises raster scanning a laser with respect to the carrier substrate.

Embodiment 21

A structure or device formed using a method as recited in any one of Embodiments 1 through 20.

Embodiment 22

The structure or device of Embodiment 21, wherein the structure or device comprises an intermediate structure formed during fabrication of at least one semiconductor device.

The example embodiments of the disclosure described above do not limit the scope of the disclosure, since these embodiments are merely examples of embodiments of the disclosure, which is defined by the scope of the appended claims and their legal equivalents. Any equivalent embodiments are intended to be within the scope of this disclosure. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of fabricating a semiconductor structure, comprising:
    forming a plurality of active components over a substrate;
    removing first portions of the substrate from an upper surface of the substrate at which the active components are located by forming trenches extending from the upper surface partially through the substrate at locations between adjacent active components of the plurality of active components;
    after forming the trenches, bonding a carrier wafer over the active components and covering the trenches with the carrier substrate;
    removing a second portion of the substrate and exposing the trenches by thinning the substrate, thinning the substrate comprising using one or more of a grinding process, a polishing process, and an etching process to remove a layer of material of the substrate having a thickness of about 500 µm or more from a lower surface of the substrate, the lower surface of the substrate opposite the upper surface of the substrate;
    transmitting laser radiation at a lasing wavelength in a range extending from about 475 nm to about 650 nm through the carrier wafer and weakening a bond between the substrate and the active components; and
    separating the carrier wafer from the substrate.

2. The method of claim 1, wherein transmitting laser radiation through the carrier wafer and weakening a bond between the substrate and the active components comprises exposing the carrier wafer to radiation at a lasing wavelength and transmitting at least about 95% of the radiation at the lasing wavelength.

3. The method of claim 2, wherein transmitting at least about 95% of the radiation at the lasing wavelength comprises transmitting at least about 99% of the radiation at the lasing wavelength.

4. The method of claim 1, wherein separating the carrier wafer from the substrate comprises separating the carrier wafer from the substrate without consuming the carrier wafer.

5. A method of fabricating semiconductor structures, comprising:
    forming a plurality of circuits over a substrate, the plurality of circuits each comprising at least one active component;
    forming trenches extending partially through the substrate from an upper surface of the substrate so as to define a plurality of semiconductor dies, each semiconductor die of the plurality comprising a circuit of the plurality and a portion of the substrate;
    after forming the trenches, bonding a carrier substrate over the semiconductor dies and covering the trenches with the carrier substrate;
    thinning the substrate and exposing the trenches by thinning the substrate and laterally isolating the semiconductor dies bonded to the carrier substrate, thinning the substrate comprising removing a layer of material of the substrate having a thickness of about 500 μm or more from a lower surface of the substrate opposite the upper surface of the substrate, each of the laterally isolated semiconductor dies comprising a thinned portion of the substrate and a circuit of the plurality on the thinned portion of the substrate;
    transmitting laser radiation at a lasing wavelength in a range extending from about 475 nm to about 650 nm through the carrier substrate and weakening a bond between the laterally isolated semiconductor dies and the carrier substrate; and
    separating the carrier substrate from the laterally isolated semiconductor dies.

6. The method of claim 5, wherein separating the carrier substrate from the laterally isolated semiconductor dies comprises separating the carrier substrate from the laterally isolated semiconductor dies without consuming the carrier substrate.

7. The method of claim 5, wherein bonding a carrier substrate over the laterally isolated semiconductor dies comprises bonding a transparent carrier substrate to the upper surface of the laterally isolated semiconductor dies.

8. The method of claim 5, wherein transmitting laser radiation through the carrier substrate and weakening a bond between the laterally isolated semiconductor dies and the carrier substrate comprises transmitting radiation at a lasing wavelength in a range from about 150 nm to about 750 nm through the carrier substrate.

9. A method of fabricating semiconductor structures, comprising:
    forming trenches extending from an upper surface of a substrate partially through the substrate between semiconductor dies formed on or in the substrate, each of the semiconductor dies comprising at least one active component;
    after forming the trenches, bonding a carrier substrate to the upper surface of each of the semiconductor dies and covering the trenches with the carrier substrate;
    removing a layer of material of the substrate having a thickness of about 500 μm or more from a lower surface of the substrate opposite the upper surface of the substrate so as to thin the substrate, expose the trenches, and laterally isolate the semiconductor dies from one another, leaving the laterally isolated semiconductor dies bonded to the carrier substrate;
    transmitting laser radiation at a lasing wavelength in a range extending from about 475 nm to about 650 nm through the carrier substrate and weakening a bond between the semiconductor dies and the carrier substrate; and
    separating the carrier substrate from the semiconductor dies so as to singulate the semiconductor dies.

10. The method of claim 9, wherein bonding a carrier substrate to the upper surface of each of the semiconductor dies comprises bonding a transparent wafer to the upper surface of each of the semiconductor dies.

11. The method of claim 9, further comprising:
    forming trenches extending partially through another substrate from an upper surface of the another substrate to define additional semiconductor dies;
    after forming the trenches, bonding the carrier substrate to the upper surface of each of the additional semiconductor dies and covering the trenches with the carrier substrate;
    removing material of the another substrate from a lower surface of the another substrate opposite the upper surface of the another substrate so as to thin the another substrate, expose the trenches, and laterally isolate the additional semiconductor dies from one another, leaving the laterally isolated additional semiconductor dies bonded to the carrier substrate;
    transmitting laser radiation through the carrier substrate and weakening a bond between the additional semiconductor dies and the carrier substrate; and
    separating the carrier substrate from the additional semiconductor dies so as to singulate the additional semiconductor dies.

12. The method of claim 9, wherein separating the carrier substrate from the semiconductor dies comprises separating the carrier substrate without consuming the carrier substrate.

13. The method of claim 9, wherein transmitting laser radiation through the carrier substrate and weakening a bond between the semiconductor dies and the carrier substrate comprises raster scanning a laser with respect to the carrier substrate.

* * * * *